United States Patent [19]

Matsushita et al.

[11] Patent Number: 4,969,020
[45] Date of Patent: Nov. 6, 1990

[54] SEMICONDUCTOR DEVICE

[75] Inventors: Tsutomu Matsushita, Yokohama; Koichi Murakami, Yokosuka, both of Japan

[73] Assignee: Nissan Motor Company Limited, Yokohama, Japan

[21] Appl. No.: 156,569

[22] Filed: Feb. 17, 1988

Related U.S. Application Data

[63] Continuation of Ser. No. 832,648, Feb. 26, 1986.

[30] Foreign Application Priority Data

Feb. 26, 1985 [JP] Japan ................................ 60-35224

[51] Int. Cl.[5] ..................... H01L 29/78; H01L 27/02; H01L 27/04
[52] U.S. Cl. ..................... 357/23.4; 357/42; 357/43; 357/48
[58] Field of Search ............. 357/23.4, 42, 43, 48

[56] References Cited

U.S. PATENT DOCUMENTS

| | | | |
|---|---|---|---|
| 4,325,180 | 4/1982 | Curran | 357/42 |
| 4,546,370 | 10/1985 | Curran | 357/43 |
| 4,608,584 | 8/1986 | Mihara | 357/23.4 |
| 4,628,341 | 12/1986 | Thomas | 357/43 |
| 4,725,561 | 2/1988 | Haond et al. | 356/49 |

FOREIGN PATENT DOCUMENTS

| | | | |
|---|---|---|---|
| 53-8571 | 1/1978 | Japan | 357/55 |
| 59-222957 | 12/1984 | Japan | 357/42 |

OTHER PUBLICATIONS

IEDM 83, "Integrated Circuits for the Control of High Power", by Robert Wrathall et al., 1983, pp. 408–411.

*Primary Examiner*—Eugene R. LaRoche
*Assistant Examiner*—Michael B. Singleton
*Attorney, Agent, or Firm*—Foley & Lardner, Schwartz, Jeffery, Schwaab, Mack, Blumenthal & Evans

[57] ABSTRACT

An improved semiconductor device having a vertical MOS and another MOS circuit such as C-MOS is shown. To insulate the circuit from influences from the operation of the vertical MOS, the vertical MOS is fabricated in a diffused region which is formed on a semiconductor substrate while the circuit is fabricated in an epitaxial layer of an opposite conductivity type to that of the substrate.

9 Claims, 7 Drawing Sheets

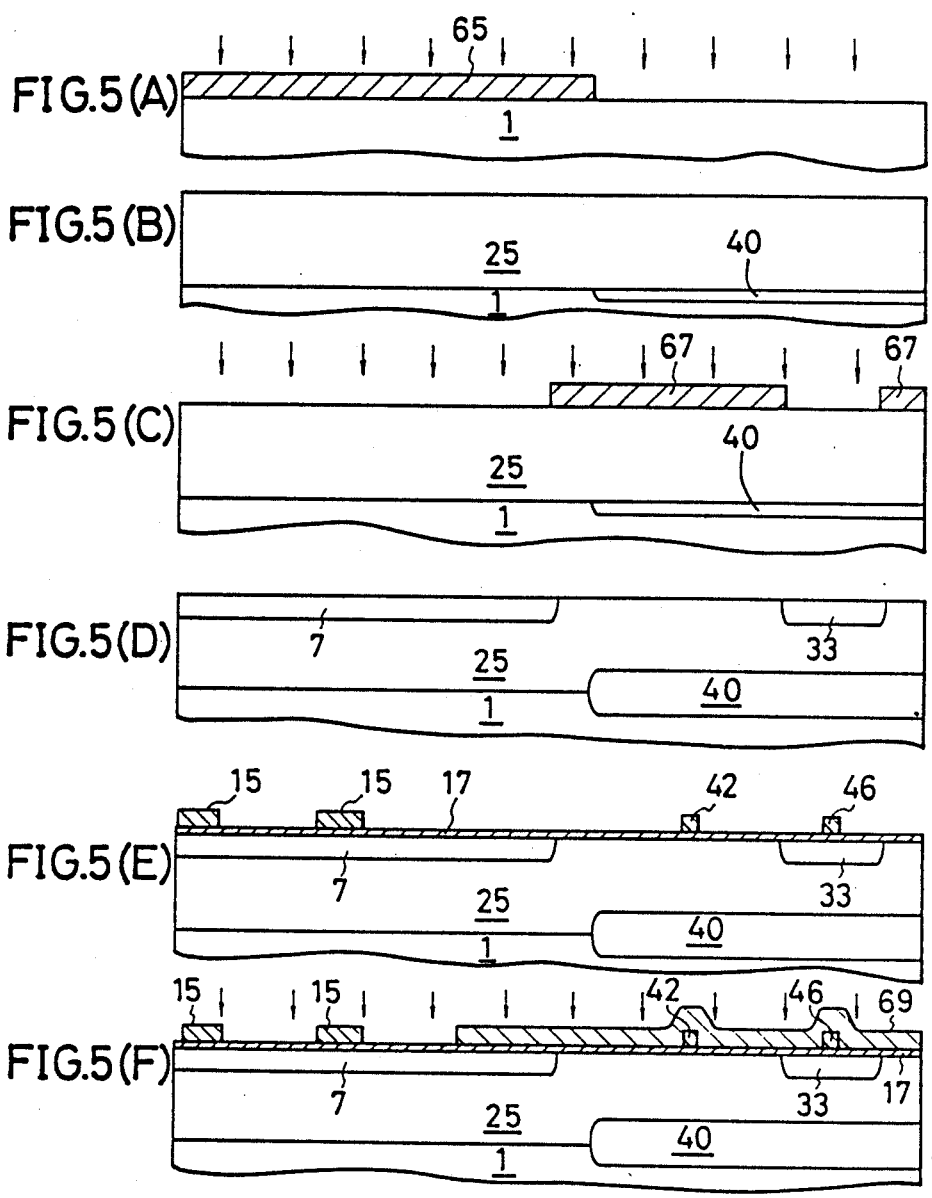

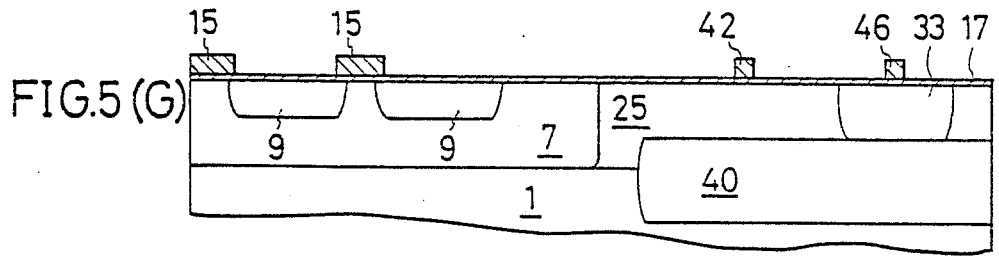
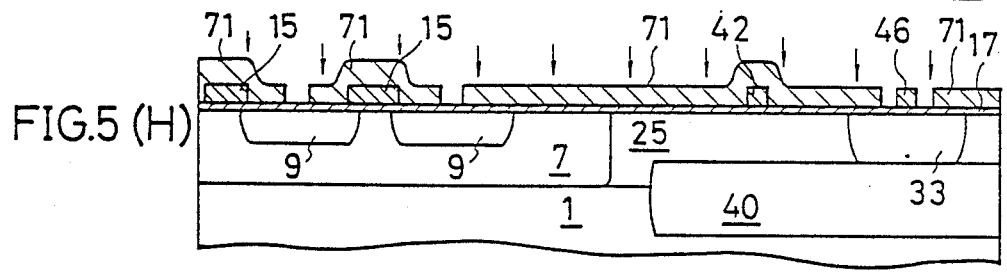
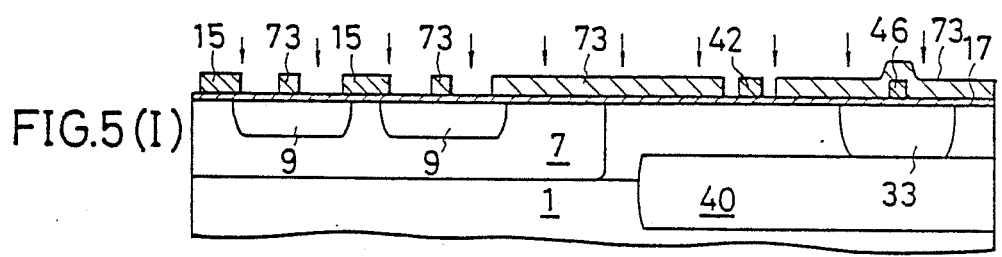
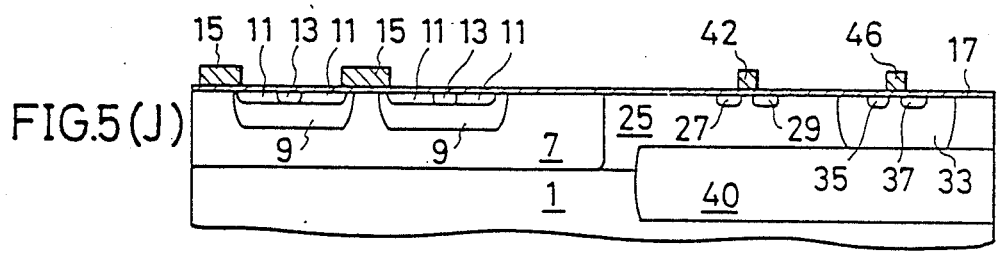
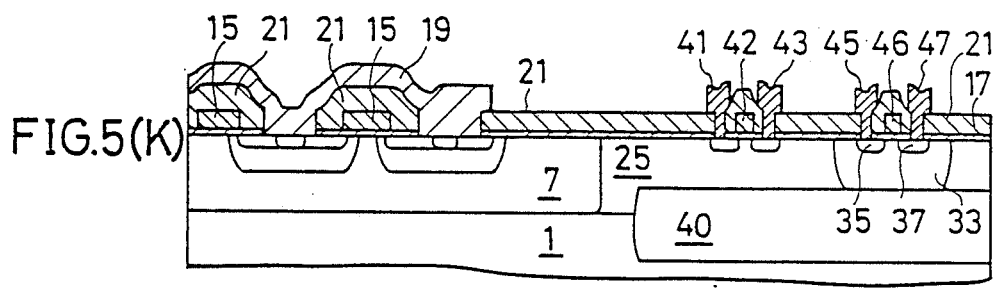

SEMICONDUCTOR DEVICE

This application is a continuation of Ser. No. 832,648, filed Feb. 26, 1986, the contents of which are hereby incorporated by reference.

BACKGROUND OF THE INVENTION

The present invention relates to a semiconductor device, specifically a power transistor in which a vertical type D-MOS transistor portion and a planar type MOS-IC portion for controlling the D-MOS transistor portion are integrated on a single semiconductor substrate.

Power MOS transistors are widely used as a switching element for different power loads. The demand for vertical type MOS transistors has especially been increasing because the vertical type MOS transistors have a low ON-resistance and are suitable for power switching.

FIG. 1 shows one example of a vertical type MOS transistor device, wherein the MOS transistor device comprises a $n^+$ type semiconductor substrate 101 and $n^-$ type semiconductor region 103 formed on the substrate by an epitaxial growth, which jointly constitute a drain region of the vertical type MOS transistor device.

It should be noted that what is meant herein by the term "vertical type" transistor is a transistor having the drain region and the source region on the opposite sides thereof.

Formed in the $n^-$ type region 103 are a plurality of p type well regions 107, which contain a pair of $n^+$ type source regions 109 and a $p^{30}$ type well contact region 111 sandwiched by the source regions 109. They are formed by impurity diffusion using as a mask a polysilicon gate 113 for gate electrode.

On the transistor device, there is also formed a gate oxide film 115, a source electrode 117, an intermediate insulating layers 119 and a final protection film or layer 121.

In this vertical type MOS transistor, for example, with a drain voltage $V_d$ applied to the bottom side of the substrate 101 through an electrode 123 and with the $n^+$ type source region 109 connected to the ground through a power load (not illustrated), the power supply to the polysilicon gate 113 is controlled to control the current flowing through the substrate 101, the n type region 103 and the $n^+$ source region 109, thereby providing the so called "switching control", thus enabling the power load to be controlled.

In the vertical type MOS transistor, however, its switching function must be carried out by the control of the voltage applied to the gate electrodes 113 as described above. Accordingly, for practical use of the device, different peripheral circuits including the one for the power supply must be connected to the vertical type MOS transistor, although not shown in the drawing.

Forming the peripheral circuits as well as the vertical type MOS transistor on a single substrate would provide some merits such as realization of compact circuits, reduction in working processes, prevention of malfunction due to dispersions in the characteristics of parts, as compared with the case where the peripheral circuits are externally connected to the MOS transistor chip.

When the vertical type MOS transistors and the peripheral circuits thereof are formed on a single substrate of the MOS transistor, the peripheral circuit or circuits must be electrically isolated from the substrate 101 and the $n^-$ type region 103 which constitute a drain, that is a path for current of the vertical MOS transister. For this end, there has heretofore been proposed, for instance, in Japanese Pat. Publication of Unexamined Application No. 58-16432, a method for forming a p type region within part of the $n^-$ type region 103 and then connecting the p type region to the earth to form the peripheral circuit in the p type region.

In order to constitute the peripheral circuit with a MOS circuit according to the method as mentioned above, however, a complicated manufacturing process is required, such as forming the p type region in the $n^-$ type region 103 by diffusion technique, then forming the $n^+$ type region in the p type region, and finally forming n-channel and p-channel MOS transistors respectively in the p type and $n^-$ type regions. In addition, the following problem occurs.

It is another object of the present invention to provide a vertical type D-MOS transistor and a planar type MOS-IC integrated on a single substrate by forming an epitaxial region on the substrate, forming a well region for the vertical type D-MOS transistor within part of the epitaxial region by diffusion throughout the epitaxial region in the direction to the substrate.

Namely, in order to reduce the ON-resistance of the vertical type MOS transistor, the $n^-$ type region 103 has to have a somewhat high impurity concentration, resulting in that the p type region formed in the $n^-$ type region 103 and the $n^+$ type regions formed in the p type region for the peripheral circuit must also have a progressively higher impurity concentration. Consequently, the threshold voltage $V_T$ of the MOS transistor formed in either p-channel or n-channel type MOS transistor tends essentially to be high and it is no longer suitable for use as a peripheral circuit.

SUMMARY OF THE INVENTION

It is an object of the present invention, therefore, to overcome the above drawbacks and to provide an improved power transistor device comprising a vertical type D-MOS transistor and a planar type MOS-IC formed on a single substrate, the MOS-IC used as peripheral circuit and having a low threshold value.

It is another object of the present invention to provide an improved semiconductor device comprising a planar type MOS-IC portion and a vertical MOS transistor portion formed on a single substrate with an epitaxial region of relatively lower impurity concentration used for junction isolation purpose therebetween.

It is another object of the present invention to provide an improved semiconductor device comprising a planar type MOS-IC portion having an epitaxial region of relatively lower impurity concentration integrated on a substrate and a vertical D-MOS transistor portion having a well region of relatively higher impurity concentration integrated on the substrate.

It is another object of the present invention to provide an improved semiconductor device wherein a buried region having a relatively higher impurity concentration is provided at a C-MOS circuit so as to prevent a latchup phenomena from occuring.

BRIEF DESCRIPTION OF THE DRAWINGS

FIGS. 5(A) through 5(K) is a process of manufacturing the semiconductor device of FIG. 2, according to the present invention.

DESCRIPTION OF THE PREFERRED EMBODIMENT

Figure 2:
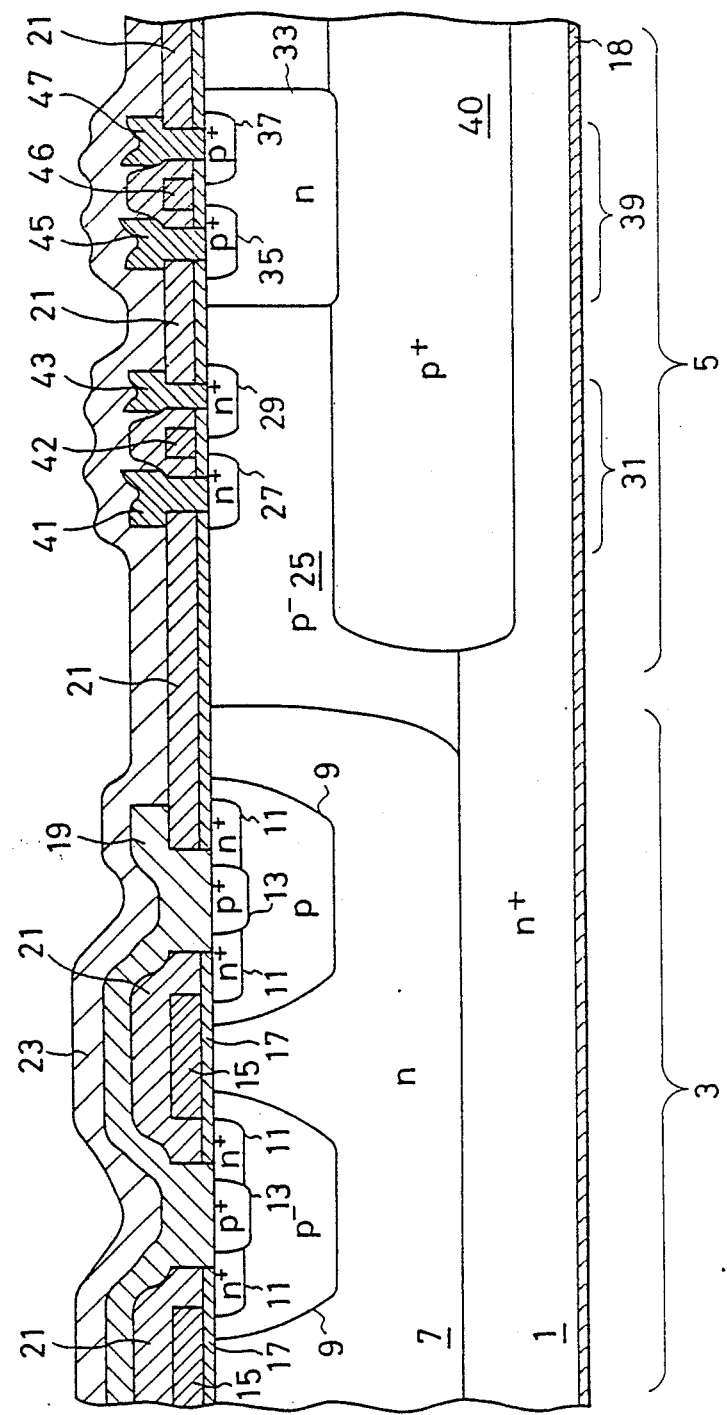
FIG. 2 is a cross-sectional view of one embodiment of the semiconductor device according to the present invention.

FIG. 2 shows a cross-sectional view of the semiconductor device comprising a vertical type D-MOS transistor portion 3 and a planar type C-MOS circuit portion 5 both formed on a single substrate 1 of first conductivity type or n+type.

Figure 1:
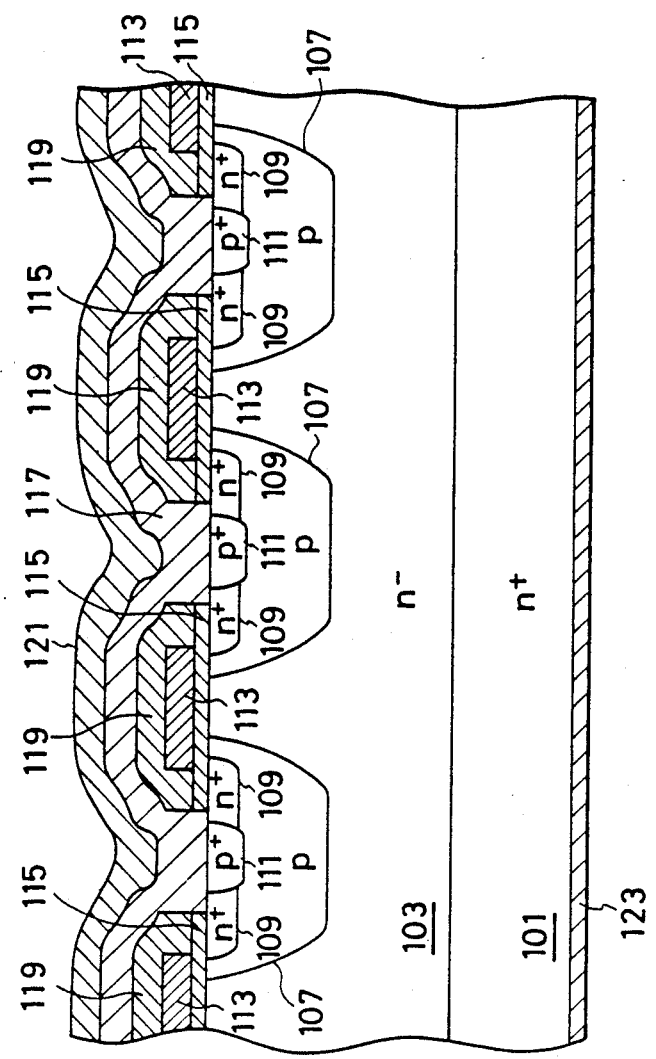
FIG. 1 is a cross-sectional view of the vertical type MOS transistor chip according to the prior art.

The structure of the vertical type D-MOS transistor portion 3 in FIG. 2 is substantially the same as that shown in FIG. 1. Namely, the MOS transistor portion 3 comprises a n+type substrate 1, a n type well region 7 formed on the n+type substrate 1, p type well regions 9 in the region 7, and a pair of n+source regions 11 and a p+well contact region 13 in the p type well region 9.

The n+type substrate 1 constitutes a first region of a first conductivity type whereas the n type well region 7 does a second region of the first conductivity type. The n type well region 7 is formed by impurity diffusion which reaches the substrate 1 as discussed hereinafter, and is also referred to simply as "well region".

The n type well region or well region 7 partly encloses the p type well regions 9 such that the p type well regions 9 are nested in the n type region 7 with their surfaces flush with each other. Similarly, the regions 11 and 13 are nested in the p type region 9. A gate oxide film 15 and a gate electrode 17 are formed to bridge the adjacent n+type source regions.

The gate oxide film 15 and gate electrode 17 are covered with an intermediate insulating film 21, a source electrode 19 and a final protection film or layer 23.

The substrate 1 and the n type well region or diffusion 7 jointly form a drain region.

On the other hand, the C-MOS circuit 5 consisting of an n channel MOS transistor or NMOS transistor 31 and a p channel MOS transistor or PMOS transistor 39. It will be noted that the substrate 1 is common to the MOS transistor 3 and the C-MOS circuit 5. Formed on the n+type substrate 1 is a p−type region 25 which is an epitaxial layer. Further, a p+buried region 40 is formed between the p−type region 25 and the n+type substrate 1 in the NMOS and PMOS transistor portions, and a n type region 33 is formed in the p−type layer 25 and in contact with the p+buried region 40. A pair of the n+type regions 27 and 29 are formed with a space therebetween in the p−region 25 as drain and source (referred to as NMOS drain region and NMOS source region, respectively), while a pair of the p+type regions 35 and 37 (referred to as PMOS drain region and PMOS source region, respectively) are formed with a space therebetween in the n type region 33. Reference numerals 41 and 43 indicate NMOS source electrode and NMOS drain electrode connected to the n+type regions 27 and 29, respectively. Numeral 42 indicates a gate electrode for the NMOS transistor 31. PMOS drain and source electrodes 45 and 47 are connected to the p+type regions 35 and 37, respectively. Numeral 46 indicates a gate electrode for the PMOS transistor 39.

In the semiconductor device having the structure described above, the p−type region 25 forms a first region of a second electric conduction type whereas the p+buried region forms a second region. When the p type epitaxial region 25 and the buried p+type layer 40 are grounded (not illustrated), the vertical type MOS transistor portion 3 is electrically isolated, specifically through junction isolation, from the C-MOS circuit portion 5 which constitutes a peripheral circuit for the vertical transistor 3 as they are reversely biased with the PN junction between the n type well region 7 and the $p^{31}$ type epitaxial region 25.

In addition, as the C-MOS circuit 5 is formed with the p−type layer 25 having a low impurity concentration, the impurity concentration of the n well region 33 formed therein can also be maintained low. Consequently, the C-MOS circuit constructed on the common substrate with the vertical type MOS transistor can have substantially the same characteristics as those of the monolithic one.

In addition, the buried P+region 40 is effective in avoiding the so-called "latch-up" phenomena which sometimes occurs in the C-MOS transistor, which is hereinafter set forth with reference to FIGS. 3 and 4.

Figure 3:
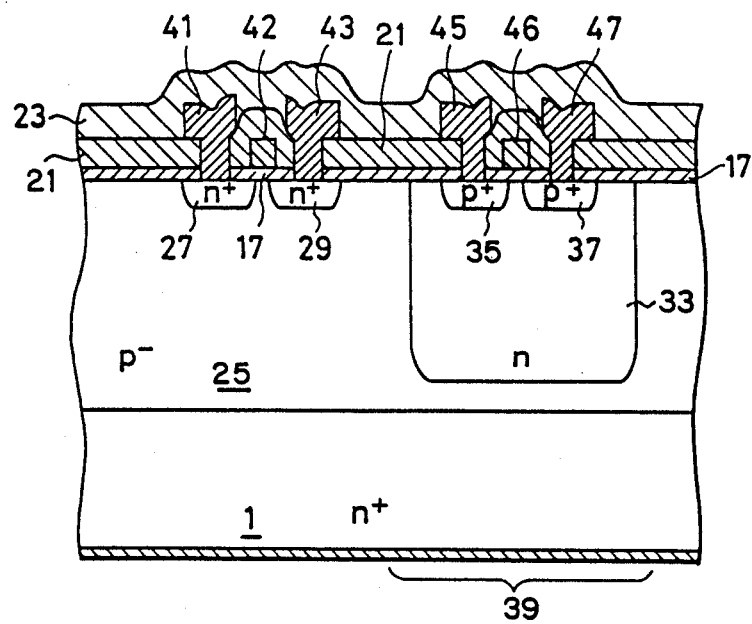
FIG. 3 is a cross-sectional view of a C-MOS circuit portion with no buried layer.
Figure 4:
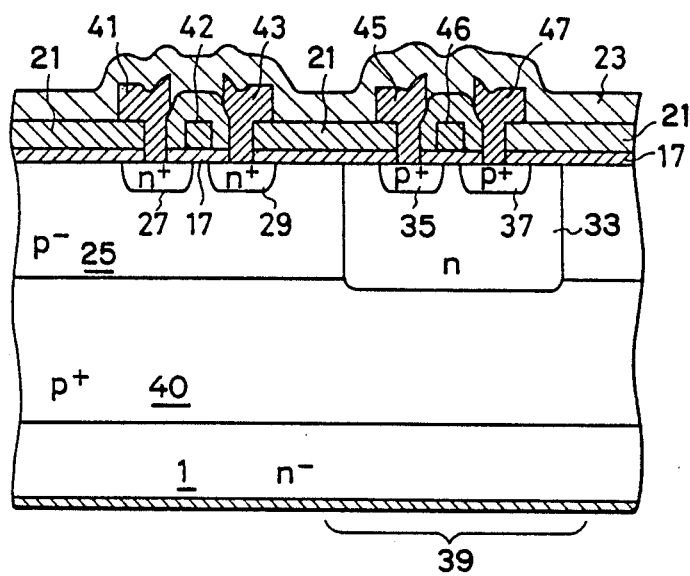
FIG. 4 is a cross-sectional view of the C-MOS circuit portion with the buried layer having a high impurity concentration for explaining the function of the semiconductor device of FIG. 2 according to the present invention in comparison with that shown in FIG. 3.

FIG. 3 shows a C-MOS circuit configuration 39 having no buried p+region whereas FIG. 4 shows the C-MOS circuit configuration of the present invention having the buried p+layer 40, which corresponds to the right portion of FIG. 2. The construction of the remaining portions of the C-MOS circuit 39 in FIG. 4 is substantially the same as that in FIG. 3 so that no additional description will be necessary. The same reference numerals are attached to the corresponding elements in FIGS. 3 and 4. It will be noted in both circuits that there is formed a parasitic PNPN junction due to the p+drain regions 35, 37, the n well region 33, either the p−epitaxial region 25 (FIG. 3) or the p+buried region 40 (FIG. 4) and the n+substrate 1.

In the C-MOS circuit 39 having no buried layer as shown in FIG. 3, the thickness of the epitaxial region 25 is determined by the break down voltage required for the vertical D-MOS transistor, so that its thickness cannot be sufficiently increased, resulting in that the distance between the n well region 33 and the substrate 1 is inclined to be rather small.

In addition, the impurity concentration of the p−region 25 is normally low. Consequently, the so-called "latch-up" phenomena often tends to occur in the C-MOS transistor, which causes the PNPN junction to render conductive.

On the other hand, in the C-MOS circuit 39 having the buried layer 40 shown in FIG. 4, the distance between the n well region 33 and the substrate 1 is sufficiently procured by the thickness of the p+buried region 40 while the impurity concentration of the p+buried region 40 is maintained rather high. As a result, the latch-up phenomena described above is difficult to occur.

FIGS. 5(A) through (K) show a process for manufacturing the vertical type MOS transistor device of one embodiment according to the present invention.

(i) In order to form the p+buried region 40 on the substrate 1, a resist 65 is first formed on an upper surface portion of the substrate 1 on which the vertical type MOS transistor 3 is formed, and then boron is implanted only on a portion of the substrate 1 on which a C-MOS circuit 5 is formed. After this process, the resist 65 is removed (see FIG. 5(A)).

(ii) Next, the p⁻epitaxial region 25 is grown on the substrate 1 (see FIG. 5(B)).

(iii) In order to form the n well region 7 for the vertical MOS transistor 3 and the n well region 33 for the PMOS of the C-MOS circuit 5 in the p⁻epitaxial region 25, a resist 67 is firstly formed at predetermined areas and then the phosphorus (P) is implanted. After this process, the resist 67 is removed (see FIG. 5(C)).

(iv) A first diffusion operation is carried out and thereby the buried region 40, the n well region 7, and the n well region 33 for the P-MOS are formed (see FIG. 5(D)).

(v) On the p⁻epitaxial layer 25 thus diffusion-processed, there is formed a gate oxide film 17 and then polysilicon gates 15, 42, 46 are formed at predetermined positions on the oxide film 17 to form gate electrodes (see FIG. 5(E)).

(vi) In order to form the p well regions 9 within the n well region 7, a resist 69 is first formed over a predetermined areas on the oxide film 17, and then boron is implanted thereon. After this process, the resist 69 is removed (see FIG. 5(F)).

(vii) A second diffusion processing is carried out so as to form the p well regions 9. It should be noted that the n well region 7 extends until it reaches the substrate 1 while the n well region 33 for the PMOS and the buried region 40 extend respectively until they contact each other (see FIG. 5(G)).

(viii) A resist 71 is generally formed on the surface of the device except for the areas where the p well contact regions 13 and the source region 37 and drain region 35 of the PMOS transistor 39 are to be formed and then the boron is implanted thereon. After this processing, the resist 71 is removed (see FIG. 5(H)).

(ix) A resist 73 is generally formed on the surface of the device except for the portions where the n+source regions 11 for the vertical MOS transistor 3, the drain region 29 and the source region 27 for the NMOS transistor 31, and then phosphorus is implanted thereto. After this processing, the resist 73 is removed (see FIG. 5(I)).

(x) A third diffusion processing is performed and the n+source regions 11, the p+well contact region 13, the n+drain region 29, the n+source region 27, the p+drain region 35, and the p+source region 37 are formed (see FIG. 5(J)).

(xi) An intermediate insulating film 21 is formed by a CVD method and selectively removed by a photo-etching to form openings at positions where electrodes are to be provided. Then aluminum vapor deposition is carried out thereon, and a source electrode 19 for the vertical MOS transistor 3, a source electrode 47 and a drain electrode 45 for the PMOS transistor 3, a drain electrode 43 and a source electrode 41 for the NMOS transistor are formed by removing the aluminum layer by the photo-etching processing except for the electrode portions to be formed (see FIG. 5(K)).

(xii) The final protection film 23 is deposited by a CVD method on the whole surface of the semiconductor device and perforations are carried at areas for forming contacts by a photo-etching method, thus completing the semiconductor device.

Figure 6:
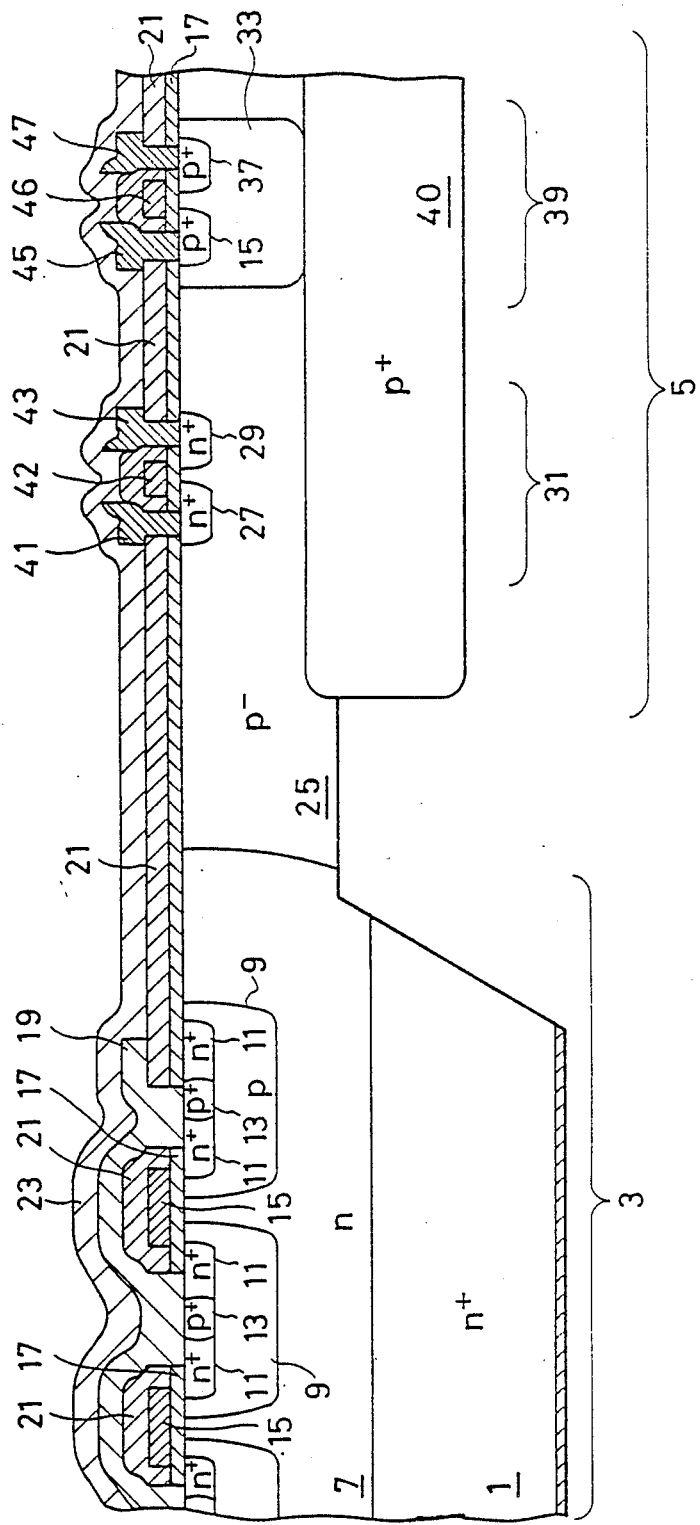
FIG. 6 is a cross-sectional view of a second embodiment of the semiconductor device according to the present invention.

FIG. 6 shows another embodiment of the semiconductor device according to the present invention. The same reference numerals as used in FIG. 2 are attached to the corresponding portions in this embodiment. A difference between this semiconductor device and that shown in FIG. 2 is that all the portion of the substrate 1 for the C-MOS circuit 5, part of the p⁻epitaxial region 25, part of the n well region 7 and part of the substrate 1 for the vertical type MOS transistor 3 in the boundary portion thereof are removed from the boundary area between the D-MOS transistor portion and the C-MOS transistor portion.

With this construction, the PNPN junction no longer exists in the PMOS transistor 39 of the C-MOS circuit 5, so that the latch-up phenomena can be completely excluded together with the existence of the buried region 40.

Furthermore, since the C-MOS circuit 5 is completely separated from the vertical type MOS transistor 3 by the PN junction lied between the n well region 7 and the p⁻epitaxial region 25, the impurity concentration of the p⁻epitaxial region 25 can be freely determined irrespective of the characteristics of the vertical MOS transistor 3. As a result, flexibility of the design for the C-MOS circuit 5 can be increased.

The elimination of those parts from the semiconductor device can be made by an etching process performed after the process shown in FIG. 5(K).

Figure 7:
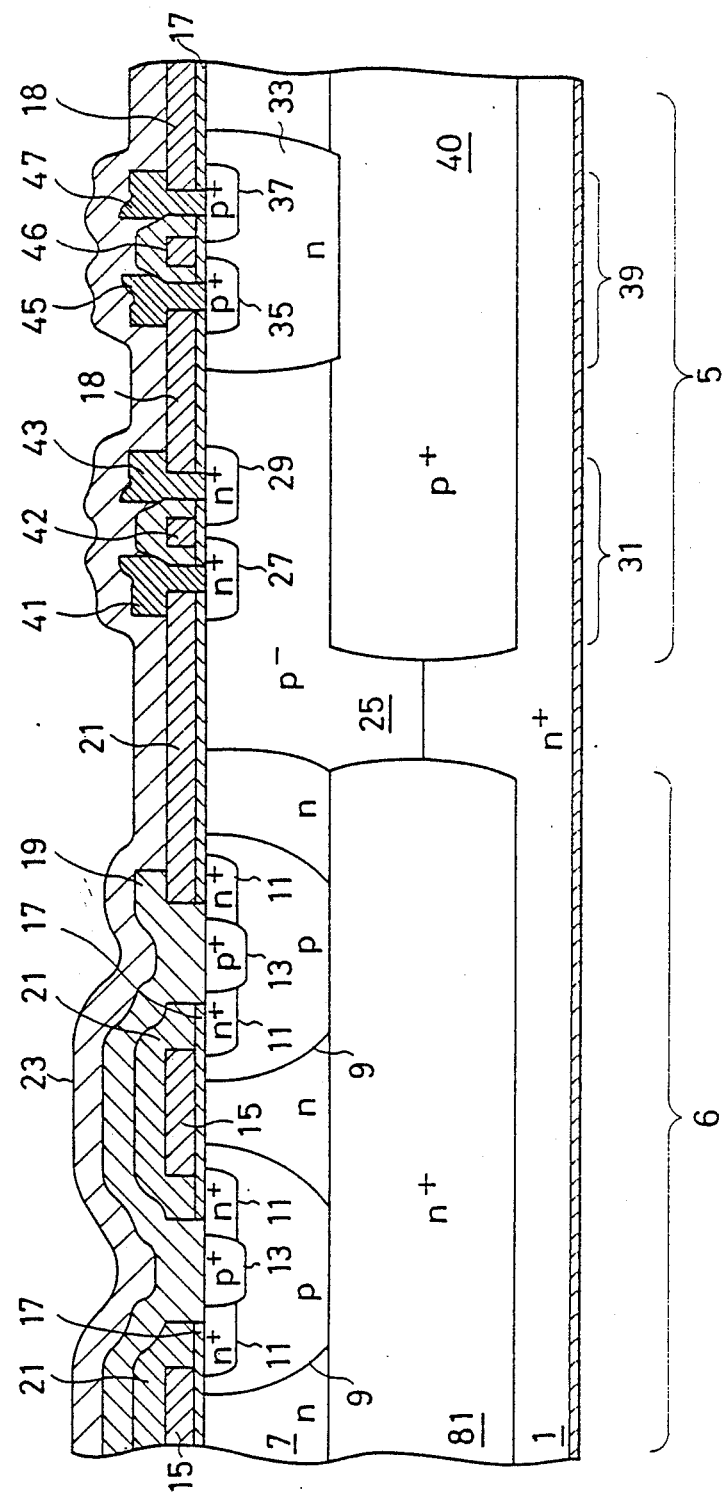
FIG. 7 is a cross-sectional view of a third embodiment of the semiconductor device according to the present invention.

FIG. 7 shows a third embodiment of the semiconductor device according to the present invention. Here again the same reference numerals are attached to the same elements as in the embodiment in FIG. 2.

In this embodiment, there is a n+buried region 81 formed between the substrate 1 and the n well region 7 in the vertical MOS transistor 3, and a PN junction is made by the n+type buried region 81 and the p well region 9. With this construction, a zener diode having a large capacity is formed in the vertical type MOS transistor 3 by the substrate 1 constituting a drain region, the n+buried region 81, the n well region 7 and the n+source region 11. As a result, the following effects can be produced;

(i) By using the semiconductor device according to the present embodiment, for the purpose of switching an inductive load, it is not necessary to increase the break down voltage required for the vertical type MOS transistor per se to a high level because a surge current produced at the time of switching flows through the zener diode formed within the semiconductor device.

(ii) Since there is no necessity of increasing the break down voltage to a high level, a vertical type MOS transistor having a lower ON resistance with a less surface area than that of the prior art with similar performance can be realized.

A process for manufacturing the semiconductor device of the third embodiment according to the present invention is as follows:

In the step (i) in FIG. 5, where after the boron is implanted as shown in FIG. 5(A), a resist is formed on the upper surface portion of the substrate 1 for the C-MOS circuit 5 and then phosphorus is implanted thereon so as to form the n+type buried region 81. The subsequent manufacturing process is similar to the manufacturing process shown in FIG. 5.

Namely, the n well region 7 and the n+type buried region 81 are formed in a portion of the p type epitaxial region 25, thereby forming a vertical type MOS transistor therein as shown in FIG. 7, wherein the C-MOS circuit 5 is never influenced by the existence of the n well region 7 and the n+buried region 81, and the C-MOS circuit 5 can precisely be constructed within the p−epitaxial region 25 with a low impurity concentration.

In the foregoing three embodiments according to the present invention, the description has teen made about the vertical type MOS transistor of n channel. However, it is apparent that the vertical type MOS transistor of n channel may be used for the embodiments as well.

Moreover, the description has also been made about the C-MOS circuit consisting of the NMOS and PMOS semiconductor. However, it is also possible that the MOS circuit may be made by a monolith of NMOS and PMOS regions.

As has been described in the foregoing, the semiconductor device according to the present invention comprises a MOS-IC and a vertical MOS transistor formed on a single substrate of a first conductivity type, such that the MOS-IC has a first region of a second conductivity type, opposite to the first conductivity type, formed on the substrate while the vertical MOS transistor has a second region of the first conductivity type formed as a result of diffusion processing in part of the first region and connected to the substrate, whereby the desired characteristics of the MOS circuit are obtained without causing the so called "latch-up phenomina".

What is claimed is:

1. An integrated semiconductor device comprising:
a semiconductor substrate of a first conductivity type;
a first region of a second conductivity type and of a low impurity concentration, the first region having a first concentration and being formed in the substrate;
a second region of the first conductivity type, the second region having a second concentration and being formed in the substrate in contact with the first region, the second concentration being greater than the first concentration, positive and negative voltages being applied to the first and second regions to apply a reverse bias to the junction between the first and second regions to electrically separate the first and second regions;
a planar type MOS-IC formed in the first region; and
a vertical type DMOS transistor formed in the second region,
the substrate and a part of the second region connected thereto constituting a drain region of the DMOS transistor,
the DMOS transistor including source regions on an opposite surface to the substrate,
the MOS-IC including source and drain regions on the same surface as that of the source regions of the DMOS transistor.

2. The device of claim 1, wherein the MOS-IC comprises a CMOS transistor including a buried region of the second conductivity type, formed between the first region and the substrate, the buried region having a higher impurity concentration than the first region.

3. The device of claim 2, wherein the CMOS transistor includes a PMOS transistor portion and a NMOS transistor portion, the PMOS transistor portion including a third region of the first conductivity type in the first region, the source and drain regions being included in the third region.

4. The device of claim 3, wherein the DMOS transistor includes fourth regions of the second conductivity type in the second region, and the two source regions included in each of the fourth regions.

5. An integrated semiconductor device comprising:
a semiconductor substrate of a first conductivity type;
a first region of a second conductivity type and of a low impurity concentration, the first region having a first concentration and being formed in the substrate;
a second region of the first conductivity type, the second region having a second concentration and being formed in the substrate in contact with the first region, the second concentration being greater than the first concentration, positive and negative voltages being applied to the first and second regions to apply a reverse bias to the junction between the first and second regions to electrically separate the first and second regions;
a planar type MOS-IC formed in the first region;
a vertical type DMOS transistor formed in the second region; and
a buried region of the second conductivity type, formed on the first region apart from the substrate, the buried region having a higher impurity concentration than that of the first region,
the substrate and a part of the second region connected thereto constituting a drain region of the DMOS transistor,
the DMOS transistor including source regions on an opposite surface to the substrate,
the MOS-IC including source and drain regions on the same surface as that of the source regions of the DMOS transistor.

6. The device of claim 5, wherein the CMOS transistor includes a PMOS transistor portion and a NMOS transistor portion, the PMOS transistor portion including a third region of the first conductivity type in the first region and the source and drain regions being included in the third region.

7. The device of claim 6, wherein the DMOS transistor includes fourth regions of the second conductivity type in the second region, and the two source regions are included in each fourth regions.

8. An integrated semiconductor device comprising:
a semiconductor substrate of a first conductivity type;
a first region of a second conductivity type and of a low impurity concentration, the first region having a first concentration and being formed in the substrate;
a second region of the first conductivity type, the second region having a second concentration and being formed in the substrate in contact with the first region, the second concentration being greater than the first concentration, positive and negative voltages being applied to the first and second regions to apply a reverse bias to the junction between the first and second regions to electrically separate the first and second regions;
a planar type MOS-IC formed in the first region;

a vertical type DMOS transistor formed in the second region;

a first buried region of the second conductivity type, formed between the first region and the substrate, the buried region having a higher impurity concentration than that of the first region; and a second buried region of the first conductivity type, formed between the second region and the substrate in contact with fourth regions of the second conductivity type, formed in the second region, to form a Zener diode in the DMOS transistor, a substrate and a part of the second region connected thereto constituting a drain region of the DMOS transistor, the DMOS transistor including source regions formed in the fourth regions on an opposite surface to the substrate, the MOS-IC including source and drain regions on the same surface as that of the source regions of the DMOS transistor.

9. The device of claim 8, wherein the DMOS transistor includes a PMOS transistor portion and a NMOS transistor portion, the PMOS transistor portion including a third region of the first conductivity type in the first region, the source and drain regions being included in the third region.

* * * * *